United States Patent [19]
Cooper

[11] Patent Number: 5,886,542
[45] Date of Patent: Mar. 23, 1999

[54] QUASI-COMPLEMENTARY BICMOS CIRCUIT WITH ENHANCED PULL DOWN TRANSISTOR CLAMP

[75] Inventor: Michael D. Cooper, Garland, Tex.

[73] Assignee: Texas Instruments Incorporated, Dallas, Tex.

[21] Appl. No.: 108,356

[22] Filed: Aug. 18, 1993

[51] Int. Cl.$^6$ .................... H03K 19/082; H03K 17/16
[52] U.S. Cl. ................................. 326/110; 326/27
[58] Field of Search .................... 307/446, 443, 307/300, 570; 326/27, 109, 110

[56] References Cited

U.S. PATENT DOCUMENTS

| | | | |
|---|---|---|---|
| 4,649,294 | 3/1987 | McLaughlin | 307/446 |
| 4,719,373 | 1/1988 | Masuda | 307/446 |
| 4,829,201 | 5/1989 | Masuda | 326/110 |
| 4,970,414 | 11/1990 | Ruth, Jr. | 326/65 |
| 5,057,713 | 10/1991 | Iwamura | 326/110 |
| 5,111,077 | 5/1992 | Young | 326/110 |
| 5,182,472 | 1/1993 | Ando | 307/446 |

OTHER PUBLICATIONS

Yano, et al. "Quasi–Complementary BiCMOS for Sub–3–V Digital Circuits", *IEEE Journal of Solid–State Circuits*, vol. 26, No. 11, Nov. 1991, pp. 1708–1718.

*Primary Examiner*—Michael J. Tokar
*Assistant Examiner*—Richard Roseen
*Attorney, Agent, or Firm*—Ronald O. Neerings; Richard L. Donaldson

[57] ABSTRACT

A quasi-complementary BICMOS circuit (46) having a clamp circuit that automatically discharges the base-collector of a pull down bipolar transistor (16) when the transistor's (16) collector voltage equalizes its base voltage. The action is immediate and does not depend on the performance of a feedback circuit to provide the timing of the arrival of the clamp signal. The clamp circuit reduces the amount of shallow saturation and quickly discharges shallow saturation after the pull down transition. The degree of shallow saturation is controllable by size selection of the clamp transistor (48). The clamp circuit also discharges the transistor's (16) base voltage to ground potential.

20 Claims, 3 Drawing Sheets

QUASI-COMPLEMENTARY BICMOS CIRCUIT WITH ENHANCED PULL DOWN TRANSISTOR CLAMP

FIELD OF THE INVENTION

The present invention relates to the field of integrated circuit devices. More specifically, the present invention relates to a quasi-complementary BICMOS circuit having automatic means for removing shallow saturation from a pull down bipolar transistor without depending on a feedback inverter.

BACKGROUND OF THE INVENTION

QC-BiCMOS (Quasi Complementary BiCMOS) circuits provide good performance for sub-micron VLSI logic gates operating in the 3.3 volt power supply region. A recognized problem with QC-BiCMOS, however, is the manner in which pull down bipolar transistors are turned off. Any practical scheme used to turn off the pull down transistor(s) must ensure that the pull down transistor(s) receive maximum base drive until the pull down transition is completed. The turn off scheme must also provide a means for discharging the shallow saturation a pull down transistor attains during the pull down transition. The problem is one of ensuring the shallow saturation is removed as soon as possible without diverting the base drive needed for a fast pull down transition.

FIG. 1 is a schematic diagram of a prior art QC-BiCMOS circuit, shown generally at 10. When node 12 is at a logic low voltage, P-channel transistor 14 provides base drive to pull down bipolar transistor 16. Transistor 14 provides base drive to transistor 16 until the collector voltage drops below the threshold of transistor 14. Enough carriers are delivered to the base node 18 to drive transistor 16 into shallow saturation forcing the collector voltage to become less than the base voltage. Some shallow saturation is desired to obtain a fast pull down transition below a Vbe. With transistor 14 turned off, base node 18 becomes a high impedance node with the base of transistor 16 being the sole discharge path. It is necessary to remove the shallow saturation once the output pull down transition is achieved. If the shallow saturation is not removed the next pull up transition could cause a transistor 20 & 16 short circuit condition when transistor 20 forces transistor 16 out of shallow saturation. The base node voltage, however must not be discharged until the output pull down transition is complete.

The inverter of transistors 22 & 24 attempts to remove the shallow saturation. The inverter of transistor 22 & 24 drives base node clamping transistor 26. When transistor 26 turns on, node 18 is discharged to ground potential, pulling transistor 16 out of shallow saturation. But, this attempt at clamping the base creates a problem. The inverter (transistors 22 & 24) must be carefully scaled to ensure the clamping signal does not arrive too early. If the clamping signal arrives early, transistor 26 will divert current desired for transistor 16 base drive. Contrariwise, if the clamping signal is delayed too much and does not arrive before the next output pull up transition, a short circuit current condition through transistors 20 and 16 may occur. Transistor 16 will still be in shallow saturation resulting in transistor 16 being in an ON state while transistor 20 is providing pull up drive. As a result, providing a properly timed clamp signal that satisfies all possible output loading conditions with this method is difficult.

The problem associated with this method of clamping the base node is shown in the SPICE simulation waveforms of FIG. 2. As can be seen, the base voltage 30 of transistor 16 remains larger than the collector voltage 28 from about 1.0 ns until the base clamp signal arrives. The base clamp signal arrival is seen when the waveform of transistor 16 goes negative (around 1.5 ns) and starts to reduce the voltage at the base of transistor 16. The shaded area denotes the time that the base voltage 30 remains larger than the collector voltage 28 indicating shallow saturation. The output 32 of FIG. 1 is restored to a zero volt potential when the output is a logic low level through ON transistors 34 and 36. When output 32 is a logic high, the output voltage is restored to Vcc potential through ON transistors 38 and 40. Inverters made of transistors 38 & 42 and 36 & 44 are scaled such that smallest turn on times for transistors 20 and 16 are provided while also satisfying the requirement that both transistors 20 and 16 do not both remain transiently on at the same time allowing a rail to rail short circuit condition to exist.

SUMMARY OF THE INVENTION

A quasi-complementary BiCMOS circuit having a clamp circuit that automatically discharges the base-collector of a pull down bipolar transistor when the transistor's collector voltage equalizes its base voltage. The action is immediate and does not depend on the performance of a feedback circuit to provide the timing of the arrival of the clamp signal. The clamp circuit reduces the amount of shallow saturation and quickly discharges shallow saturation after the pull down transition. The degree of shallow saturation is controllable by size selection of the clamp transistor. The clamp circuit also discharges the transistor's base voltage to ground potential.

BRIEF DESCRIPTION OF THE DRAWINGS

The novel features believed characteristic of the invention are set forth in the, appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
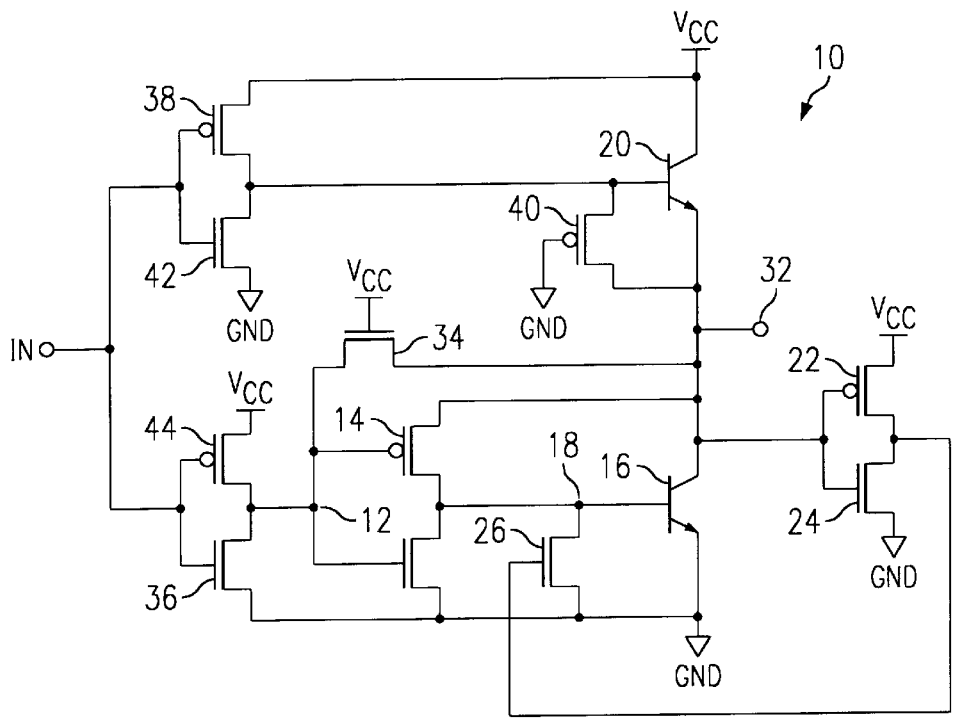
FIG. 1 is a schematic diagram of a prior art QC-BiCMOS (Quasi Complementary BiCMOS) circuit.
Figure 2:
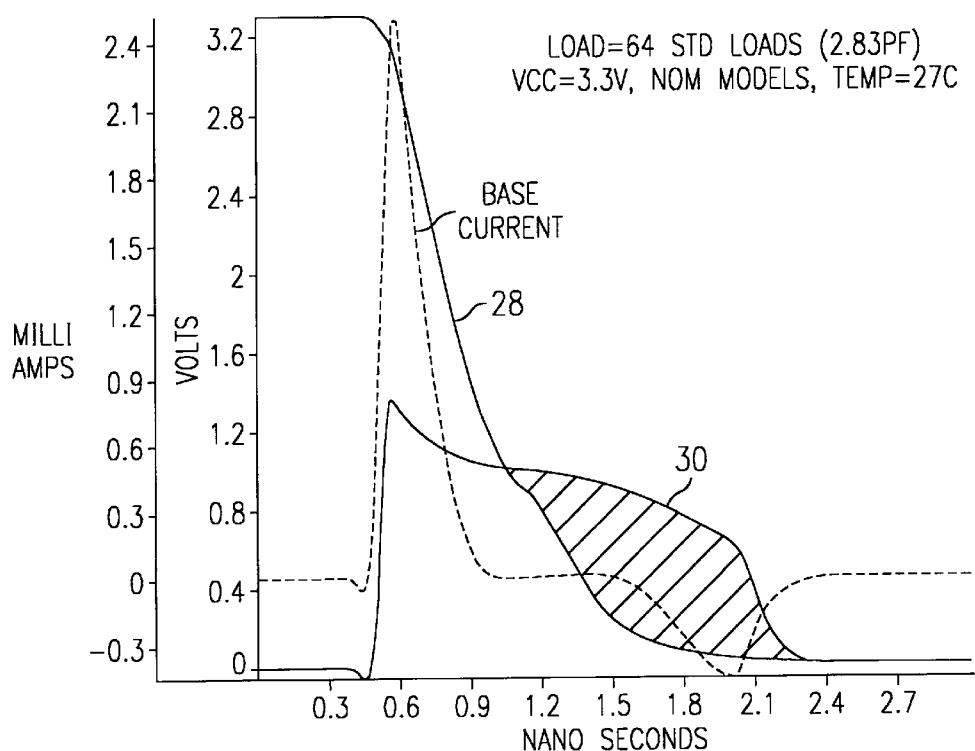
FIG. 2 is a graph of SPICE simulation waveforms for the circuit of FIG. 1.
Figure 3:
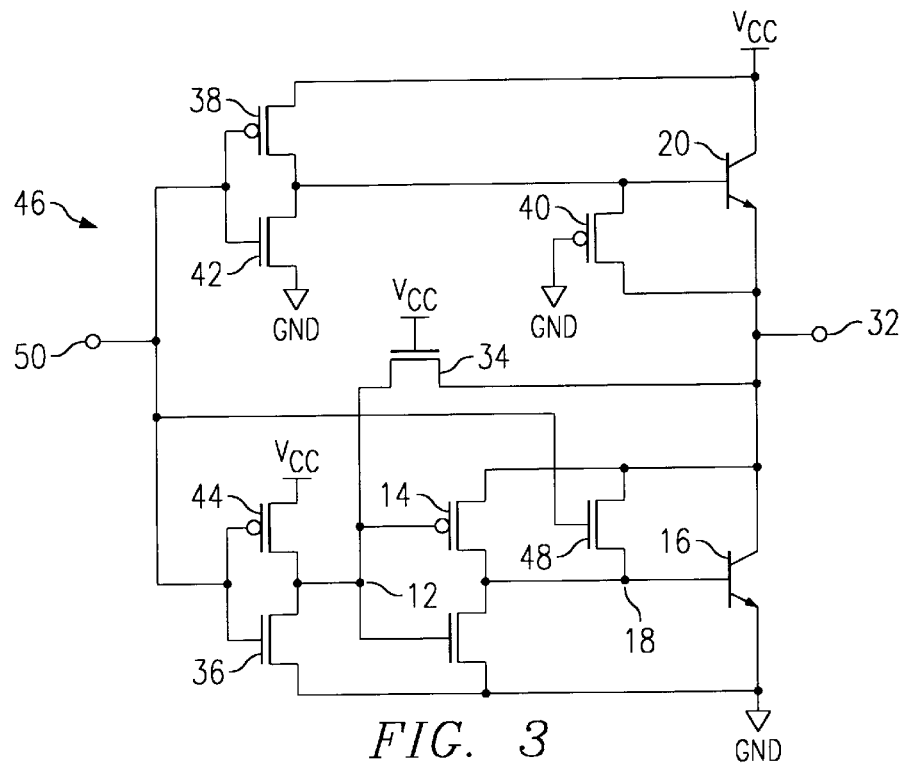
FIG. 3 is a schematic diagram of a QC-BiCMOS (Quasi Complementary BiCMOS) circuit according to one embodiment of the invention.
Figure 4:
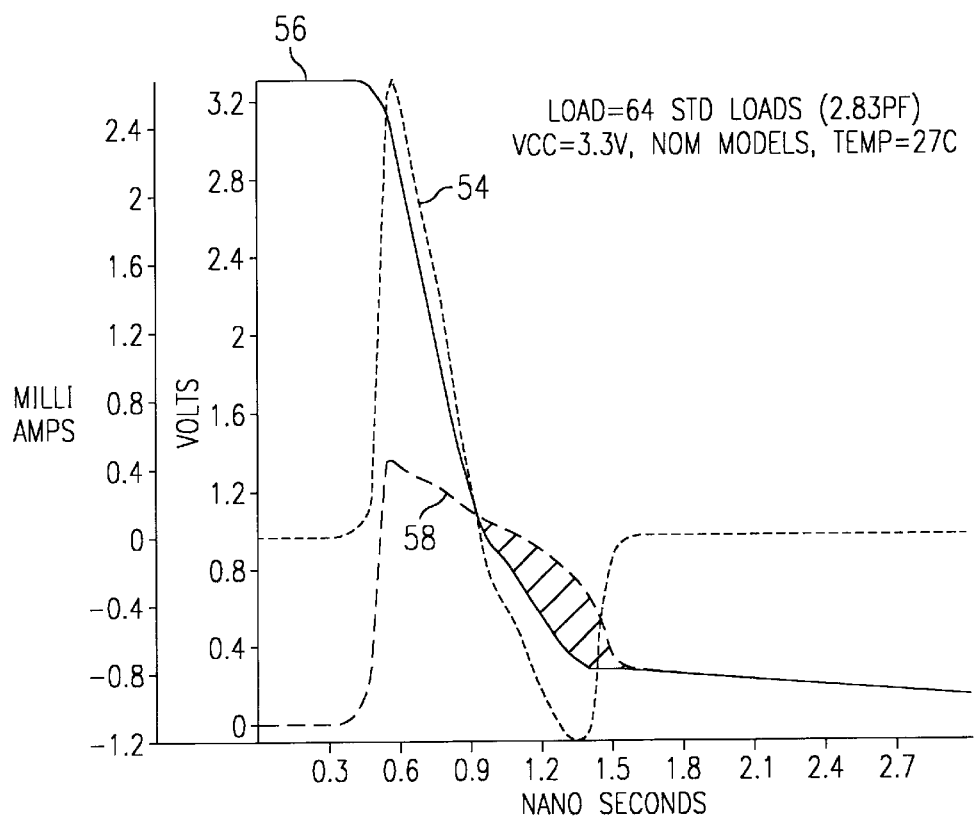
FIG. 4 is a graph of SPICE simulation waveforms for the circuit of FIG. 3.

FIG. 3 is a schematic diagram of a QC-BiCMOS (Quasi Complementary BiCMOS) circuit, generally at 46, having an N-channel clamp transistor 48 connected between the base and collector of transistor 16. Transistor 48 remains ON while transistor 16's collector voltage is dropping since the gate is connected to input node 50 which is at a logic high voltage. A short circuit discharge path for the shallow saturation charge stored in the base-collector of transistor 16 is immediately available when transistor 16's collector voltage becomes equal to the base voltage. The base of transistor 16 is also discharged to ground potential through fully ON transistor clamp transistor 48 plus ON transistors 34 and 36. As can be seen in the SPICE wave form in FIG. 4, the base current wave form 54 of transistor 16 indicates the immediate discharge effect of transistor 48. Transistor 16's base current is seen to immediately start to become negative when the collector voltage 56 becomes equal to the base voltage 58. The shaded area indicates the time that the collector voltage becomes less than the base voltage indicating shallow saturation. As can be seen the new clamp provides a reduction in the amount of shallow saturation and the time it takes to discharge the shallow saturation after a fast high to low transition is made, as compared with amount of shallow saturation and time it takes to discharge the shallow saturation after a fast high to low transition of the circuit of FIG. 1.

Figure 5:
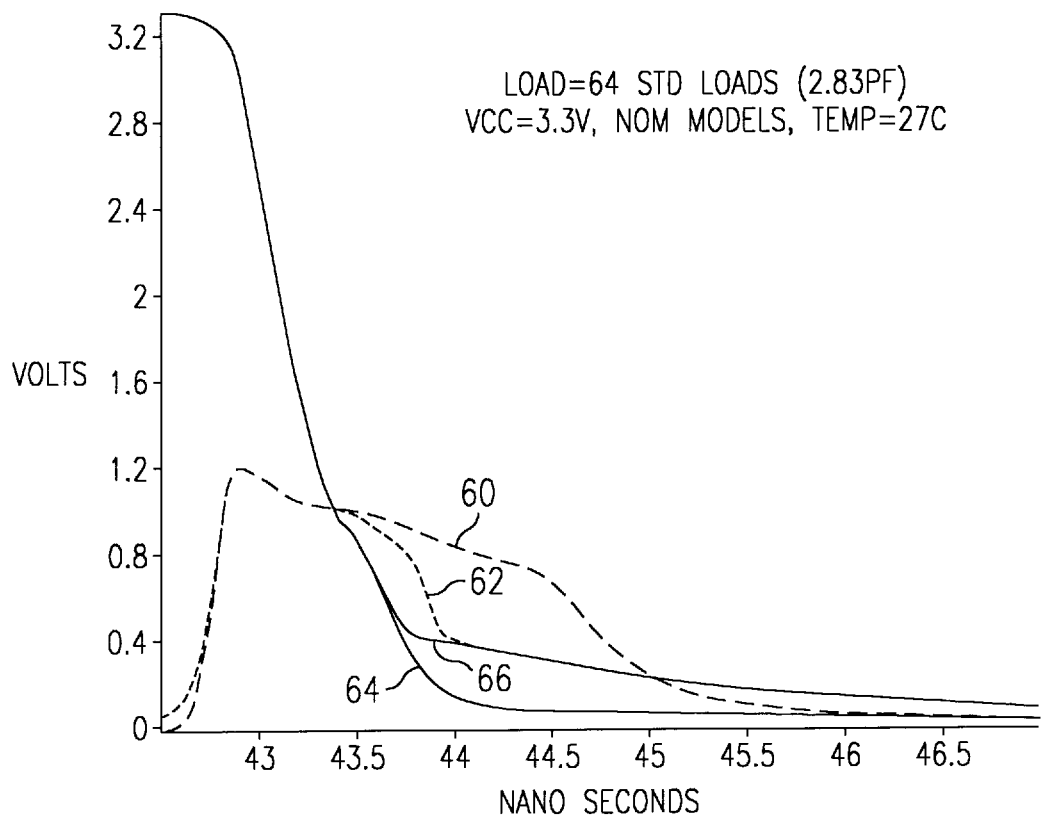
FIG. 5 is another graph of SPICE simulation waveforms for the circuit of FIG. 3.

The size of transistor 48 determines the degree of shallow saturation that transistor 16 will be allowed to obtain. A zero impedance transistor 48 will completely short out the base-collector of transistor 16 and remove all saturation immediately. This is not a desired result. As previously pointed out, some shallow saturation is needed to obtain a fast high to low transition below a Vbe. As seen in FIG. 5, a small gate width (1.0 um) for transistor 48 allows a long period of relatively large shallow saturation to happen (graph line 60 is the base voltage of transistor 16 when it has a gate width of 1.0 um & graph line 64 is the collector voltage of transistor 16 when it has a gate width of 1.0 um). Using a gate width 9.0 um provides a much smaller amount of shallow saturation to occur (graph line 62 is the base voltage of transistor 16 when it has a gate width of 9.0 um & graph line 66 is the collector voltage of transistor when it has a gate width of 9.0 um). This shallow saturation is also removed in a shorter time. The last part of the fast pull down transition ends at about 0.4V rather the 0V obtained when more shallow saturation is allowed. The 0.4V is not a problem since it is well below the threshold of any gate that will be driven by the output. The 0.4V is returned to 0V through ON transistors 48, 34 and 36. A further advantage of transistor 48 includes the extra base drive provided to transistor 16. Area is also saved by using transistor 48 instead of a feedback inverter and base clamp transistor as was done in the prior art.

Thus, the circuit of FIG. 3 automatically discharges the base-collector of transistor 16 when transistor 16's collector voltage equalizes the voltage on the base of transistor 16. The action is immediate and does not depend on the performance of a feedback circuit to provide the timing of the arrival of the clamp signal. The new clamp circuit reduces the amount of shallow saturation and quickly discharges shallow saturation after the pull down transition. The degree of shallow saturation is controllable by size selection of the new clamp transistor 48. The new clamp circuit also discharges transistor 16's base voltage to ground potential.

While this invention has been described with reference to an illustrative embodiment, this description is not to be construed in a limiting sense. Various modifications to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A device, comprising:
   a quasi-complementary BiCMOS circuit having a pull down bipolar transistor; and
   a means for removing shallow saturation charge stored in the pull down transistor's base-collector, said means not utilizing a feedback inverter.
2. The device of claim 1 wherein said means for removing shallow saturation charge stored in the pull down transistor's base-collector removes the shallow saturation once output pull down transition is achieved.
3. The device of claim 1 wherein said means automatically discharges the base-collector of the pull down transistor when its collector voltage equalizes its base voltage.
4. The device of claim 1 wherein said means comprises a clamp circuit connected to said pull down transistor.
5. The device of claim 4 wherein said clamp circuit comprise s a transistor connected to said pull down transistor.
6. The device of claim 5 wherein said transistor of said clamp circuit is connected between the collector and base of the pull down transistor.
7. The device of claim 6 wherein said transistor of said clamp circuit is a FET transistor.
8. The device of claim 7 wherein said FET transistor is an N-channel transistor.
9. A device, comprising:
   a quasi-complementary BiCMOS circuit having a pull down bipolar transistor; and
   a pull down transistor clamp connected to said pull down transistor, said clamp not utilizing a feedback circuit.
10. The device of claim 9 wherein said pull down transistor clamp removes shallow saturation charge stored in the pull down transistor's base-collector.
11. The device of claim 9 wherein said feedback circuit comprises at least one inverter.
12. The device of claim 9 wherein said clamp removes shallow saturation charge stored in the pull down transistor's base-collector once output pull down transition is achieved.
13. The device of claim 9 wherein said clamp automatically discharges the base-collector of the pull down transistor when its collector voltage equalizes its base voltage.
14. The device of claim 9 wherein said transistor of said clamp circuit is connected between the collector and base of the pull down transistor.
15. The device of claim 14 wherein said transistor of said clamp circuit is a FET transistor.
16. The device of claim 15 wherein said FET transistor is an N-channel transistor.
17. A method, comprising:
   providing a quasi-complementary BiCMOS circuit having a pull down bipolar transistor; and
   providing a means for removing shallow saturation charge stored in the pull down transistor's base-collector, said means not utilizing a feedback inverter.
18. The method of claim 17 wherein said means for removing shallow saturation charge stored in the pull down transistor's base-collector removes the shallow saturation once output pull down transition is achieved.
19. The device of claim 17 wherein said means automatically discharges the base-collector of the pull down transistor when its collector voltage equalizes its base voltage.
20. The device of claim 17 wherein said means comprises a clamp circuit connected to said pull down transistor.

* * * * *